United States Patent
Sakamaki et al.

(10) Patent No.: US 11,118,248 B2
(45) Date of Patent: Sep. 14, 2021

(54) CR ALLOY TARGET MATERIAL

(71) Applicant: HITACHI METALS, LTD., Tokyo (JP)

(72) Inventors: Koichi Sakamaki, Tokyo (JP); Kazuya Saito, Tokyo (JP); Hiroaki Sogame, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 146 days.

(21) Appl. No.: 16/476,119

(22) PCT Filed: Dec. 5, 2017

(86) PCT No.: PCT/JP2017/043547
§ 371 (c)(1),
(2) Date: Jul. 5, 2019

(87) PCT Pub. No.: WO2018/131328
PCT Pub. Date: Jul. 19, 2018

(65) Prior Publication Data
US 2019/0352746 A1 Nov. 21, 2019

(30) Foreign Application Priority Data
Jan. 12, 2017 (JP) .............................. JP2017-003496

(51) Int. Cl.
*C22C 27/06* (2006.01)
*B22F 3/10* (2006.01)
*B22F 3/15* (2006.01)
*C23C 14/34* (2006.01)

(52) U.S. Cl.
CPC .............. *C22C 27/06* (2013.01); *B22F 3/10* (2013.01); *B22F 3/15* (2013.01); *C23C 14/34* (2013.01)

(58) Field of Classification Search
CPC .............. C22C 27/06; C22F 1/11; B22F 3/15
See application file for complete search history.

(56) References Cited

U.S. PATENT DOCUMENTS 5,718,778 A 2/1998 Murata et al.

FOREIGN PATENT DOCUMENTS

| CN | 102756126 | 10/2012 |
|---|---|---|
| CN | 102978576 | 3/2013 |
| JP | H08269700 | 10/1996 |

(Continued)

OTHER PUBLICATIONS

"Search Report of Europe Counterpart Application", dated Aug. 3, 2020, p. 1-p. 7.

(Continued)

Primary Examiner — Jessee R Roe
(74) Attorney, Agent, or Firm — JCIPRNET

(57) ABSTRACT

Provided is a Cr alloy target material with which formation of craters on the surface of the Cr alloy target material during film formation can be limited and the adhesion of droplets on the material being treated can be limited. The Cr alloy target material is represented by an atom ratio composition formula of $Cr_{100-x-y}M1_xM2_y$, wherein $0.1 \leq x \leq 21.0$, $0.1 \leq y \leq 23.0$, M1 is at least one kind of element selected from Ti and V, and M2 is at least one kind of element selected from Mo, Mn, B, W, Nb and Ta, with the balance being unavoidable impurities. The Cr alloy target material contains 10-1000 mass ppm of oxygen as an unavoidable impurity.

1 Claim, 7 Drawing Sheets 2 0 mm

(56) References Cited

FOREIGN PATENT DOCUMENTS

| | | |
|---|---|---|
| JP | 2000038662 | 2/2000 |
| JP | 2000199055 | 7/2000 |
| JP | 2003226963 | 8/2003 |
| JP | 2005336611 | 12/2005 |
| JP | 2011252227 | 12/2011 |
| JP | 2012237056 | 12/2012 |
| TW | I515321 | 1/2016 |
| TW | 201631170 | 9/2016 |

OTHER PUBLICATIONS

"Office Action of China Counterpart Application", dated Sep. 24, 2020, with English translation thereof, p. 1-p. 17.
"Written Opinion of the International Searching Authority (Form PCT/ISA/237) of PCT/JP2017/043547," dated Jan. 30, 2018, with English translation thereof, pp. 1-9.
"Office Action of India Counterpart Application", dated Aug. 14, 2020, with English translation thereof, p. 1-p. 4.
"International Search Report (Form PCT/ISA/210) of PCT/JP2017/043547," dated Jan. 30, 2018, with English translation thereof, pp. 1-4.
"Office Action of Indonesia Counterpart Application", dated Aug. 14, 2020, with English translation thereof, p. 1-p. 4.

2 0 mm 2 0 mm 20 mm 20 mm 20 mm 20 mm 20 mm 20 mm 20 mm 20 mm 2 0 m m 2 0 m m

CR ALLOY TARGET MATERIAL

CROSS-REFERENCE TO RELATED APPLICATION

This application is a 371 application of the International PCT application serial no. PCT/JP2017/043547, filed on Dec. 5, 2017, which claims the priority benefit of Japan Patent Application No. 2017-003496, filed on Jan. 12, 2017. The entirety of each of the abovementioned patent applications is hereby incorporated by reference herein and made a part of this specification.

TECHNICAL FIELD

The present invention relates to a Cr alloy target material for vacuum deposition, and particularly, to a Cr alloy target material useful as an evaporation source according to an arc ion plating method.

BACKGROUND ART

In order to improve the wear resistance and seizure resistance, for example, a hard film made of a Cr alloy is applied to the surface of a cutting tool, a sliding component, a mold or the like. In order to coat a hard film made of a Cr alloy, an ion plating method using a Cr alloy target material as an evaporation source is generally applied.

An arc ion plating method, which is a type of ion plating method, is a method in which, in a reaction gas atmosphere with a reduced pressure, a target material which is a raw material of a hard film is instantly dissolved and ionized by arc discharge and is adhered to a negatively-applied material to be treated to form a hard film. Compared to an ion plating method using an electron gun or the like, in an arc ion plating method, an ionization rate of an evaporated metal is higher and a hard film having excellent adhesion is obtained, and thus this method is currently increasingly being applied.

The Cr alloy target material used in the arc ion plating method is composed of a plate material having a desired composition and is generally produced by a powder sintering method. A hard film formed using this Cr alloy target material may become separated by a cutting tool or a sliding component during use, and nowadays when a high cutting speed in a cutting tool and more reliability for a sliding component are required, improvement thereof is required.

Thus, for example, Patent Literature 1 proposes that, in a sputtering target material containing Cr as a main component and containing aluminum, silicon, titanium, and the like, a content of oxygen, carbon, sulfur, and hydrogen as impurity elements is controlled such that it is 3,000 ppm by mass or less. The sputtering target material disclosed in Patent Literature 1 is a material useful for forming a hard film having strong adhesion.

CITATION LIST

Patent Literature

[Patent Literature 1]
Japanese Unexamined Patent Application Publication No. 2003-226963

SUMMARY OF INVENTION

Technical Problem

The inventors found a new problem that, when a hard film is formed on a material to be treated by an arc ion plating method using a Cr alloy target material containing Ti and V, an abnormal discharge is generated, and additionally innumerable droplets are scattered from the Cr alloy target material and adhere to the material to be treated. The droplets are disadvantageous because they cause deterioration in the smoothness of the hard film, and particularly, inhibit improvement of the wear resistance and seizure resistance of a cutting tool or a sliding component, and droplets fall off from the material to be treated, which causes another risk of the cutting tool or the sliding component being damaged.

Thus, the inventors found that the problem of generation of droplets occurs when local melting occurs mainly due to oxidatively active elements such as Ti and V contained in the Cr alloy target material, and craters with a diameter of 0.5 mm or more are formed on the surface of the Cr alloy target material.

In order to address the above problem, the present invention provides a novel Cr alloy target material in which it is possible to limit generation of craters on the surface of the Cr alloy target material and it is possible to limit adhesion of droplets to a material to be treated during film formation.

Solution to Problem

The inventors conducted extensive studies regarding causes of droplets generated in a Cr alloy target material containing Ti and V during film formation, and as a result, found that, when an amount of oxygen contained in a target material is set to a predetermined amount, it is possible to limit generation of craters on the surface of the Cr alloy target material and it is possible to limit prevent adhesion of droplets to a material to be treated. In addition, the inventors found that, in addition to the content of oxygen, when a total content of S, Al, and Si contained in the Cr alloy target material is limited to a predetermined amount or less, it is possible to limit generation of craters, and thereby completed the present invention.

That is, the present invention provides a Cr alloy target material having a composition formula in terms of an atomic ratio of $Cr_{100-x-y}M1_xM2_y$, $0.1 \leq x \leq 21.0$, $0.1 \leq y \leq 23.0$, in which M1 represents at least one element type selected from Ti and V, M2 represents at least one element type selected from Mo, Mn, B, W, Nb, and Ta, with the remainder being unavoidable impurities, in which 10 to 1,000 ppm by mass of oxygen is contained in the unavoidable impurities.

In addition, in the Cr alloy target material of the present invention, preferably, 50 to 700 ppm by mass of oxygen is contained.

In addition, in the Cr alloy target material of the present invention, more preferably, 300 ppm by mass or less of a total content of S, Al, and Si as unavoidable impurities is contained.

In addition, in the Cr alloy target material of the present invention, most preferably, 60 ppm by mass or less of a total content of S, Al, and Si as unavoidable impurities is contained.

Advantageous Effects of Invention

The present invention can provide a Cr alloy target material in which, when a Cr alloy hard film is applied to a material to be treated, it is possible to limit generation of craters on the surface of the Cr alloy target material and it is possible to limit adhesion of droplets to a material to be treated, and which is useful for hard film coating on the surface of a cutting tool, a sliding component, a mold or the like.

DESCRIPTION OF EMBODIMENTS

Figure 1:
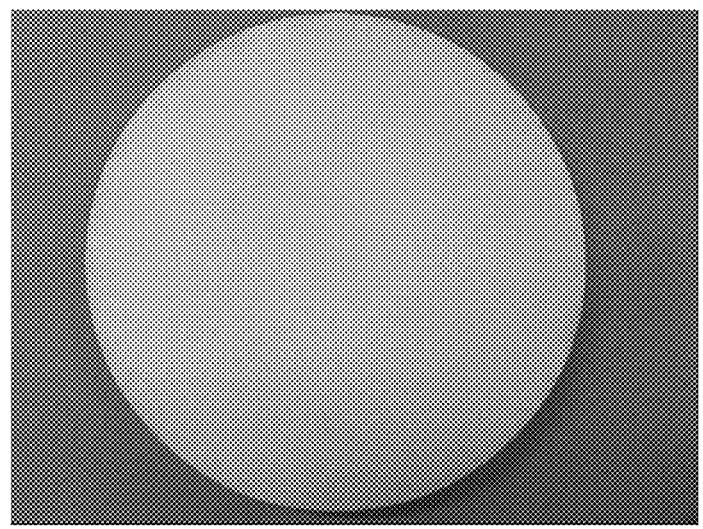
FIG. 1 is a surface observation image of a Cr alloy target material of Present Example 1 after use.

An important feature of the present invention is that a content of oxygen is controlled such that it is a predetermined amount in order to limit generation of craters with a diameter of 0.5 mm or more formed on the surface of a Cr alloy target material which is disadvantageous in formation of a hard film. When generation of the craters is limited, adhesion of droplets to a material to be treated can be limited.

The Cr alloy target material of the present invention is a Cr alloy target material which has a composition formula in terms of an atomic ratio of $Cr_{100-x-y}M1_xM2_y$, $0.1 \leq x \leq 21.0$, $0.1 \leq y \leq 23.0$, in which M1 represents at least one element type selected from Ti and V and M2 represents at least one element type selected from Mo, Mn, B, W, Nb, and Ta, with the remainder being unavoidable impurities, in which 10 to 1,000 ppm by mass of oxygen is contained in the unavoidable impurities. Here, in the Cr alloy target material of the present invention, each main constituent element is indicated in atom % with respect to all main constituent elements, and unavoidable impurities other than main constituent elements are represented by ppm by mass in the entire Cr alloy target material.

Regarding the M1 element, a content of at least one element type selected from Ti and V is set in a range in which the oxidation resistance of the coated Cr alloy hard film is improved and the hardness of the hard film is not significantly impaired and a total content of the M1 element is limited to 0.1 to 21.0 atom %. In addition, in consideration of the oxidation resistance of the obtained hard film, a total content of the M1 element is preferably 0.5 atom % or more.

In addition, in consideration of the hardness of the obtained hard film, a total content of the M1 element is preferably 15.0 atom % or less.

In addition, regarding the M2 element, a content of at least one element type selected from Mo, Mn, B, W, Nb, and Ta is set in a range in which the seizure resistance of the coated Cr alloy hard film can be improved and also pores formed due to the decrease in sinterability when the Cr alloy target material is produced by a powder sintering method or the like can be limited, and a total content of the M2 element is limited to 0.1 to 23.0 atom %. In addition, in consideration of seizure resistance of the obtained hard film, a total content of the M2 element is preferably 0.5 atom % or more. In addition, in consideration of the productivity, a total content of the M2 element is preferably 15.0 atom % or less.

Thus, in the Cr alloy target material of the present invention, in order to improve thermal conduction of the obtained hard film, a total content of the M1 element and the M2 element is more preferably less than 10 atom %.

In the Cr alloy target material of the present invention, a content of oxygen is 10 to 1,000 ppm by mass.

Oxygen reacts with at least one element type selected from Ti and V in the Cr alloy target material when a raw material powder is sintered to produce the Cr alloy target material, and forms an oxide phase of which an electrical conductivity is significantly different from that of other metallic phases. In particular, when coating is performed by an arc ion plating method or the like, there is a risk of the oxide phase becoming a starting point of generation of local melting and craters causing adhesion of droplets being generated on the surface of the Cr alloy target material. Therefore, in the Cr alloy target material of the present invention, the upper limit of the content of oxygen is 1,000 ppm by mass.

On the other hand, when an oxidatively active element such as at least one element type selected from Ti and V is contained, it is very difficult to make a content of oxygen contained in the Cr alloy target material less than 10 ppm by mass. In this regard, in the Cr alloy target material of the present invention, a content of oxygen is 10 to 1,000 ppm by mass. In addition, in order to limit formation of the oxide phase, a content of oxygen is preferably 700 ppm by mass or less and more preferably 500 ppm by mass or less. In addition, in consideration of the productivity, a content of oxygen is preferably 50 ppm by mass or more and more preferably 100 ppm by mass or more.

In the Cr alloy target material of the present invention, a total content of S, Al, and Si is preferably 300 ppm by mass or less. Compared to main constituent elements of the Cr alloy target material of the present invention, S and Al have a very low melting point, and easily become a starting point of generation of local melting during film formation, that is, a starting point of craters. In addition, Si reacts with main constituent elements in the Cr alloy target material of the present invention to form a brittle phase and easily becomes a starting point of craters, and also during film formation and handling, damage such as cracks in the Cr alloy target material body may occur, and an abnormal discharge resulting from the cracking may be caused. Therefore, in the Cr alloy target material of the present invention, a total content of S, Al, and Si is preferably 300 ppm by mass or less. In addition, for the same reason as above, a total content of S, Al, and Si is more preferably 60 ppm by mass or less.

On the other hand, since it is very difficult to reduce a content of S, Al, and Si in the Cr alloy target material to the limit, realistically, a total content of S, Al, and Si is preferably 1 ppm by mass or more. In consideration of the productivity, a total content of S, Al, Si is more preferably 10 ppm by mass or more.

The Cr alloy target material of the present invention can be obtained by mixing, for example, a Cr powder, a powder composed of at least one element type selected from Ti and V, and a powder composed of at least one element type selected from Mo, Mn, B, W, Nb, and Ta, as raw material powders, and pressure sintering them.

The Cr powder used as the raw material powder can be obtained, for example, by mechanically crushing Cr flakes with a purity of 99.9 mass % or more produced by electrolytic refining and subjecting them to a vacuum heat treatment or a reduction treatment in a hydrogen atmosphere. Further, regarding the Cr powder, powder particles with a particle size of 500 μm or less are preferably used. Thereby, it is possible to improve a mixability with other metal powders, and it is possible to obtain a homogeneous sintered product. In addition, regarding the Cr powder, powder particles with a particle size of 45 μm or more are preferably used. Thereby, it is possible to reduce an amount of volatile impurities adsorbed on the surface of the Cr powder and therefore an amount of oxygen in the Cr alloy target material is preferably controlled such that it is within the above range.

In addition, the Ti powder used as the raw material powder can be produced by, for example, temporarily hydrogenating an ingot with a purity of 99.9 mass % or more, which is obtained by vacuum secondary refining Ti sponge, and performing mechanical crushing, and then performing a dehydrogenation treatment. Thus, regarding the Ti powder, powder particles with a particle size of 500 μm or less are preferably used. Therefore, it is possible to improve a mixability with a Cr powder and other metal powders, and it is possible to obtain a homogeneous sintered product. In addition, regarding the Ti powder, powder particles with a particle size of 1 μm or more are more preferably used. Therefore, it is possible to reduce an amount of volatile impurities adsorbed on the surface of the Ti powder and it is preferable to control a content of oxygen in the Cr alloy target material to be within the above range.

In addition, the V powder used as the raw material powder can be produced by, for example, crushing an ingot with a purity of 99.9 mass % or more, which is obtained by repeating secondary refinement according to electron beam melting, with a V—Al alloy refined by an aluminum thermite method. Here, regarding the V powder, powder particles with a particle size of 500 μm or less are preferably used. Therefore, it is possible to improve mixability with the Cr powder and other metal powders, and it is possible to obtain a homogeneous sintered product. In addition, regarding the V powder, powder particles with a particle size of 1 μm or more are preferably used. Therefore, it is possible to reduce an amount of volatile impurities adsorbed on the surface of the V powder and a content of oxygen in the Cr alloy target material is preferably controlled such that it is within the above range.

In addition, in order to limit generation of droplets, in a powder composed of at least one element type selected from Mo, Mn, B, W, Nb, and Ta, a content of oxygen contained as impurities is preferably reduced to 1,000 ppm by mass or less. Then, regarding this powder, powder particles with a particle size of 1 to 150 μm are preferably used. Therefore, the Cr alloy target material of the present invention is preferable because an oxide phase causing droplets is reduced and a content of oxygen is controlled such that it is within the above range.

In the present invention, for pressure sintering, for example, a hot isostatic pressing method, a hot pressing method, an electric sintering method, and the like can be applied. Particularly preferably, when a sintering temperature is set to 900 to 1,300° C., and an applied pressure is set to 50 MPa or more, it is possible to obtain a sintered product in which formation of a brittle intermetallic compound phase is sufficiently limited and favorable sintering is possible without impairing a sintering density.

Example 1

In order to obtain a Cr alloy target material as Present Example 1, regarding the Cr powder, a powder in which Cr flakes with a purity of 99.9 mass % produced by electrolytic refining were crushed by a ball mill and subjected to a vacuum heat treatment, and then classified using a sieve with an opening of 300 μm was prepared. In addition, regarding the Ti powder, a powder in which a Ti powder with a purity of 99.9 mass % was produced by collecting cutting chips from an ingot with a purity of 99.9 mass %, which was obtained by vacuum secondary refining Ti sponge, performing hydrogenating once and crushing, and then performing a dehydrogenation treatment, and classified using a sieve with an opening of 150 μm was prepared. In addition, regarding the V powder, a powder in which an ingot with a purity of 99.9 mass % obtained by repeating secondary refinement according to electron beam melting was additionally crushed with a V—Al alloy refined by an aluminum thermite method and then classified using a sieve with an opening of 150 μm was prepared. In addition, regarding the B powder, a commercial B powder with a purity of 99 mass % was classified using a sieve with an opening of 45 μm to prepare a powder.

In order to obtain a Cr alloy target material as Present Example 2, regarding the Cr powder, a powder in which Cr flakes with a purity of 99.99 mass % produced by electrolytic refining were crushed by a ball mill and subjected to a reduction treatment in a hydrogen atmosphere and then classified using a sieve with an opening of 150 μm was prepared. In addition, regarding the Ti powder, a powder in which a Ti powder with a purity of 99.9 mass % was produced by collecting cutting chips from an ingot with a purity of 99.9 mass %, which was obtained by vacuum secondary refining Ti sponge, performing hydrogenating once and crushing, and then performing a dehydrogenation treatment, and classified using a sieve with an opening of 45 μm was prepared. In addition, regarding the V powder and the B powder, the same powders as in Present Example 1 were prepared.

The powders prepared as above were weighed out so that a composition formula in terms of an atomic ratio was $Cr_{90.2}M1_{5.2}M2_{4.6}$, and specifically $Cr_{90.2}Ti_{4.7}V_{0.5}B_{4.6}$, and then mixed in a V type mixer, filled into a soft iron capsule, and subjected to degassing sealing under conditions of 450°

C. for 4 hours, and then subjected to hot isostatic pressing under conditions of a temperature 1,180° C., a holding pressure of 100 MPa, and a holding time of 1 hour, and were pressure-sintered to produce sintered products.

The obtained sintered products were subjected to machining processing to have a diameter of 105 mm and a thickness of 16 mm and thereby Cr alloy target materials were produced.

In order to obtain a Cr alloy target material as Present Example 3, the Cr powder and Cr flakes with a purity of 99.9 mass % produced by electrolytic refining used in Present Example 1 were crushed by a ball mill, and no vacuum heat treatment was then performed, and classification using a sieve with an opening of 300 μm was performed to prepare a Cr mixed powder in which the Cr powder was mixed in at 3:1. In addition, regarding the Ti powder, the V powder and the B powder, the same powders as in Present Example 1 were prepared. The powders prepared as above were weighed out so that a composition formula in terms of an atomic ratio was $Cr_{90.2}M1_{5.2}M2_{4.6}$, and specifically $Cr_{90.2}Ti_{4.7}V_{0.5}B_{4.6}$ and then mixed in a V type mixer, and subjected to pressure sintering under the same sintering conditions as above, and thereby a Cr alloy target material as Present Example 3 was prepared.

In order to obtain a Cr alloy target material as Comparative Example 1,

Cr flakes with a purity of 99.9 mass % produced by electrolytic refining were crushed by a ball mill, and no vacuum heat treatment was then performed, and classification using a sieve with an opening of 300 μm was performed to prepare a Cr powder. In addition, regarding the Ti powder, the V powder and the B powder, the same powders as in Present Example 1 were prepared. The powders prepared as above were weighed out so that a composition formula in terms of an atomic ratio was $Cr_{90.2}M1_{5.2}M2_{4.6}$, and specifically $Cr_{90.2}Ti_{4.7}V_{0.5}B_{4.6}$, and then mixed in a V type mixer, and subjected to pressure sintering under the same sintering conditions as above, and thereby a Cr alloy target material as Comparative Example 1 was prepared.

In order to obtain a Cr alloy target material as Comparative Example 2, a Cr mixed powder in which the Cr powder used in Present Example 2 and the Cr powder used in Comparative Example 1 were mixed at 1:1 was prepared. In addition, regarding the Ti powder, the V powder and the B powder, the same powders as in Present Example 1 were prepared. The powders prepared as above were weighed out so that a composition formula in terms of an atomic ratio was $Cr_{90.2}M1_{5.2}M2_{4.6}$, and specifically $Cr_{90.2}Ti_{4.7}V_{0.5}B_{4.6}$, and then mixed in a V type mixer, and subjected to pressure sintering under the same sintering conditions as above, and thereby a Cr alloy target material as Comparative Example 2 was prepared.

Regarding the Cr alloy target materials produced as above, in order to measure contents of the elements, Ti, V, and B were determined through ICP emission spectroscopy, oxygen was analyzed by an inert gas melting-infrared absorption method, S was analyzed by a high frequency combustion-infrared absorption method, and Al and Si were analyzed through atomic absorption spectroscopy.

In addition, regarding the above Cr alloy target materials, a bulk density was measured by collecting gas over water, and a relative density was calculated by multiplying a value obtained by dividing this bulk density by a theoretical density obtained as a weighted average for the individual elements calculated using the mass ratio obtained from the composition ratio of the Cr alloy target material by 100.

The component analysis values and the relative density values of the Cr alloy target materials are shown in Table 1.

The Cr alloy target materials produced as above were placed on a cathode of an arc ion plating device (model: S-20, commercially available from Kobe Steel, Ltd.), and the inside of the chamber was vacuum-exhausted, the inside of the chamber was heated at 450° C. for 1 Hr, and then a metal bombardment treatment was performed under conditions of an Ar gas pressure 0.5 Pa, a target current of 100 A, and a bias voltage of 600 V for 2 minutes.

Then, the surfaces of the Cr alloy target materials after use used in the metal bombardment treatment were observed, and the number of craters with a diameter of 0.5 mm or more causing adhesion of droplets was measured. The results are shown in Table 1. Here, in Table 1, the Cr alloy target materials were evaluated such that, when the number of craters exceeded 200, this is expressed as "exceeding 200" and when the number of craters was 200 or less, the measured number is indicated.

TABLE 1

| Sample No. | Component value [atom %] | | | | Unavoidable impurities [mass ppm] | | | | | Relative density [%] | Number of craters [number] | Note |
|---|---|---|---|---|---|---|---|---|---|---|---|---|
| | Cr | Ti | V | B | O | S | Al | Si | S + Al + Si | | | |
| 1 | Bal. | 4.7 | 0.5 | 4.5 | 282 | 5 | 10 | 10 | 25 | 100.3 | 0 | Present Example 1 |
| 2 | Bal. | 4.7 | 0.5 | 4.4 | 677 | 8 | 10 | 20 | 38 | 97.4 | 0 | Present Example 2 |
| 3 | Bal. | 4.8 | 0.5 | 4.8 | 781 | 31 | 10 | 20 | 61 | 100.4 | 98 | Present Example 3 |
| 4 | Bal. | 4.8 | 0.5 | 4.7 | 4,639 | 175 | 10 | 40 | 225 | 98.8 | Exceeding 200 | Comparative Example 1 |
| 5 | Bal. | 4.7 | 0.5 | 4.9 | 1,760 | 70 | 10 | 20 | 100 | 100.3 | Exceeding 200 | Comparative Example 2 |

Figure 2:
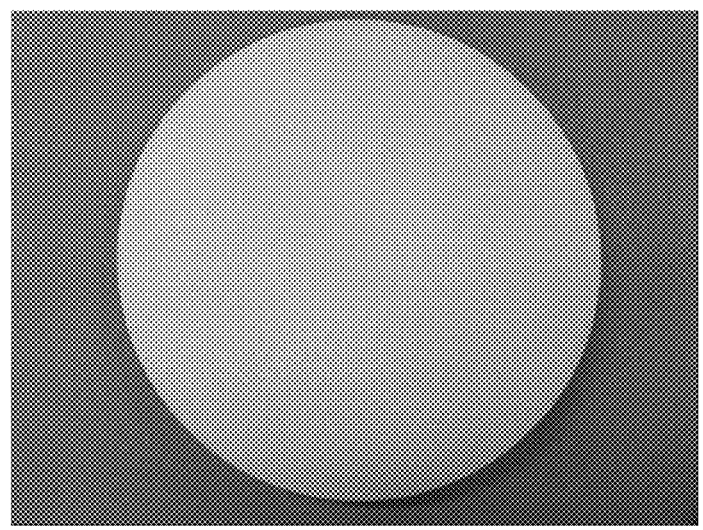
FIG. 2 is a surface observation image of a Cr alloy target material of Present Example 2 after use.
Figure 3:
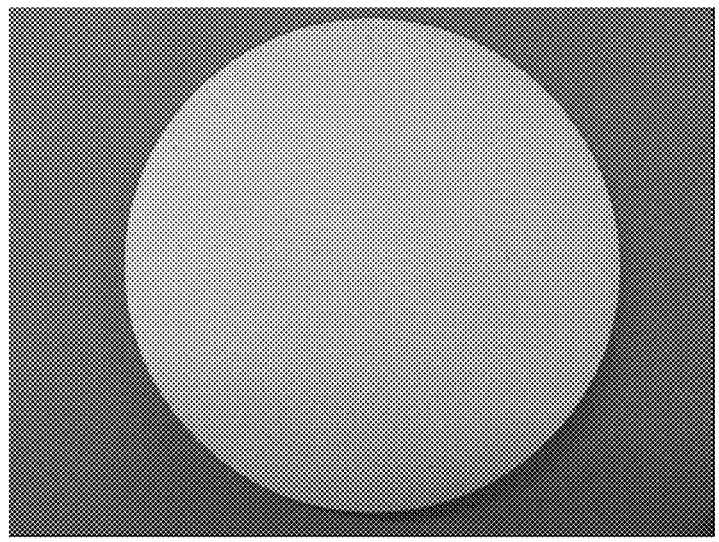
FIG. 3 is a surface observation image of a Cr alloy target material of Present Example 3 after use.

FIG. 1 to FIG. 3 show surface observation images of the Cr alloy target materials of Present Example 1 to Present Example 3 after use. In addition, FIG. 4 and FIG. 5 show surface observation images of the Cr alloy target materials of Comparative Example 1 and Comparative Example 2 after use.

Figure 4:
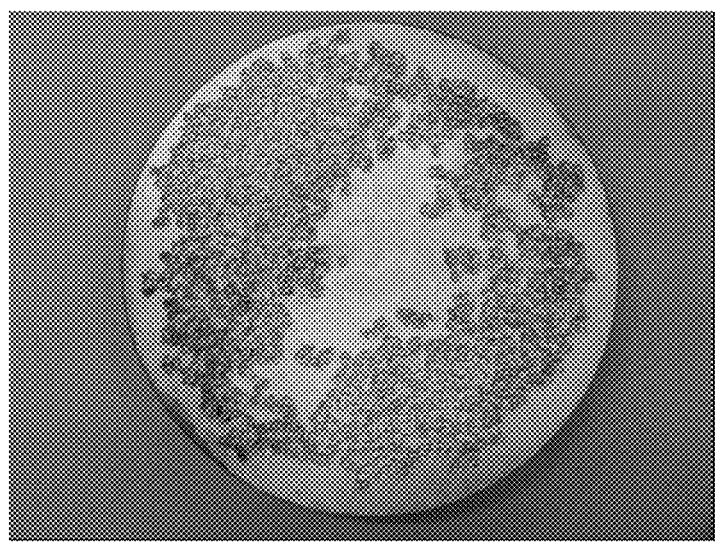
FIG. 4 is a surface observation image of a Cr alloy target material of Comparative Example 1 after use.
Figure 5:
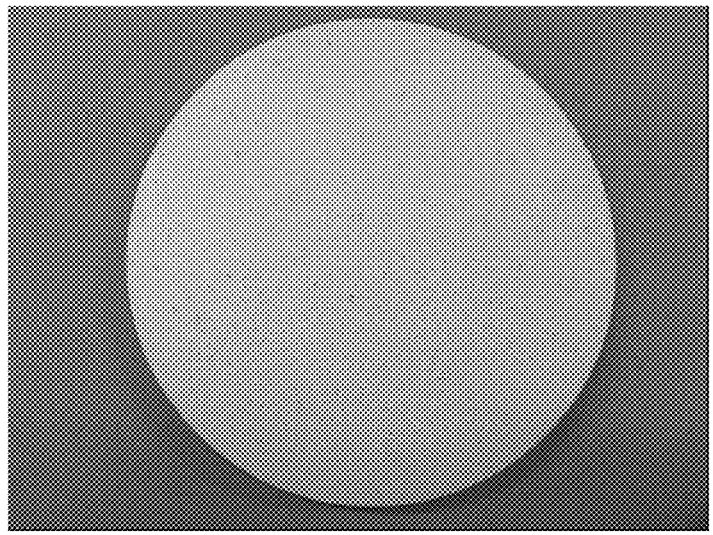
FIG. 5 is a surface observation image of a Cr alloy target material of Comparative Example 2 after use.
Figure 6:
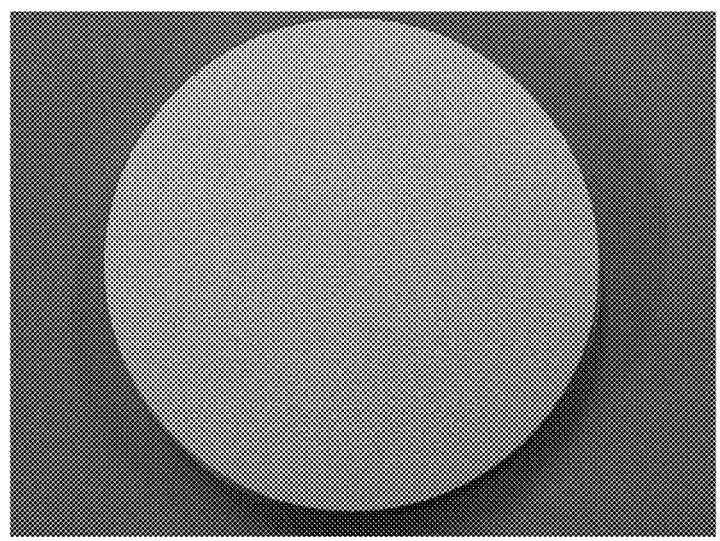
FIG. 6 is a surface observation image of a Cr alloy target material of Present Example 4 after use.
Figure 7:
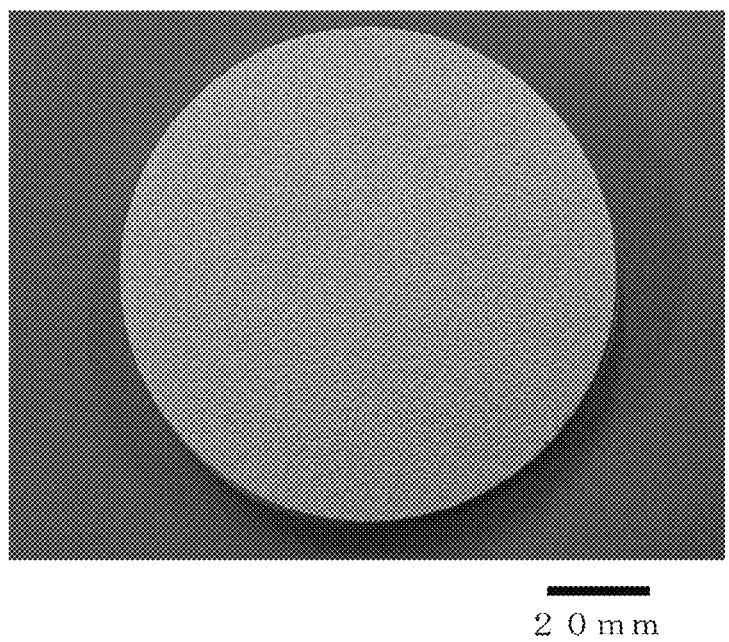
FIG. 7 is a surface observation image of a Cr alloy target material of Present Example 5 after use.
Figure 8:
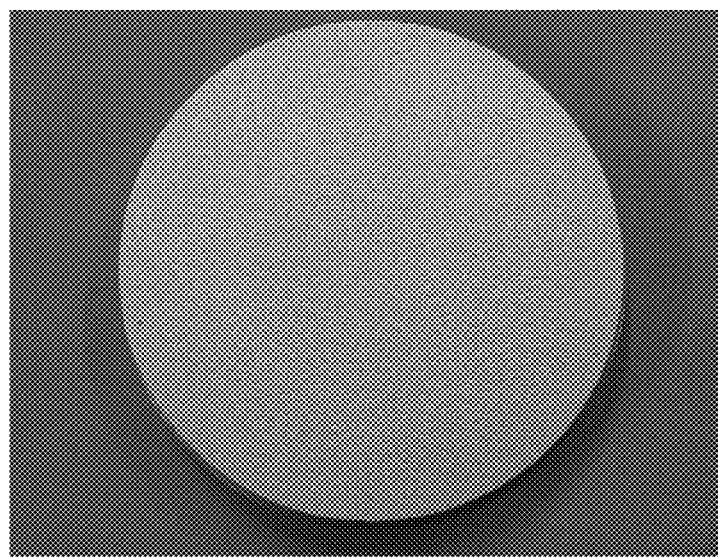
FIG. 8 is a surface observation image of a Cr alloy target material of Present Example 6 after use.
Figure 9:
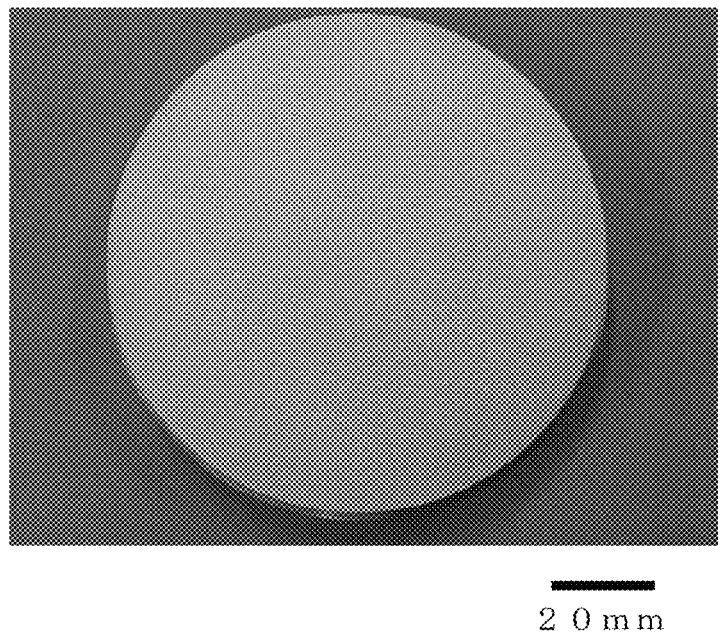
FIG. 9 is a surface observation image of a Cr alloy target material of Present Example 7 after use.
Figure 10:
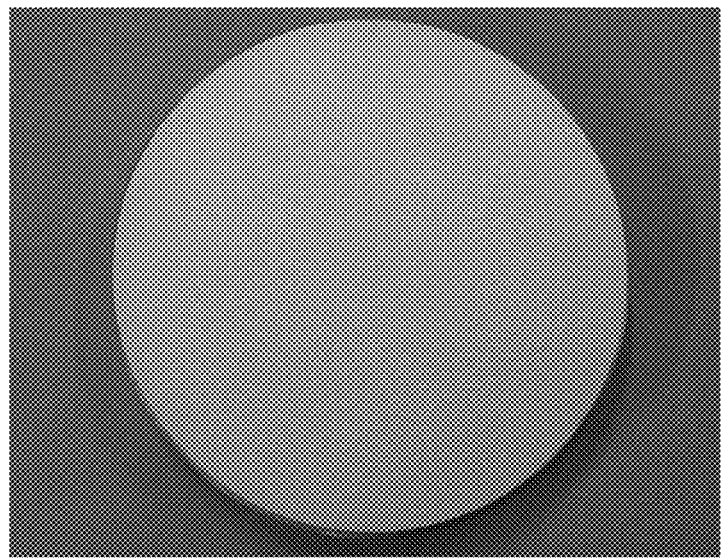
FIG. 10 is a surface observation image of a Cr alloy target material of Present Example 8 after use.
Figure 11:
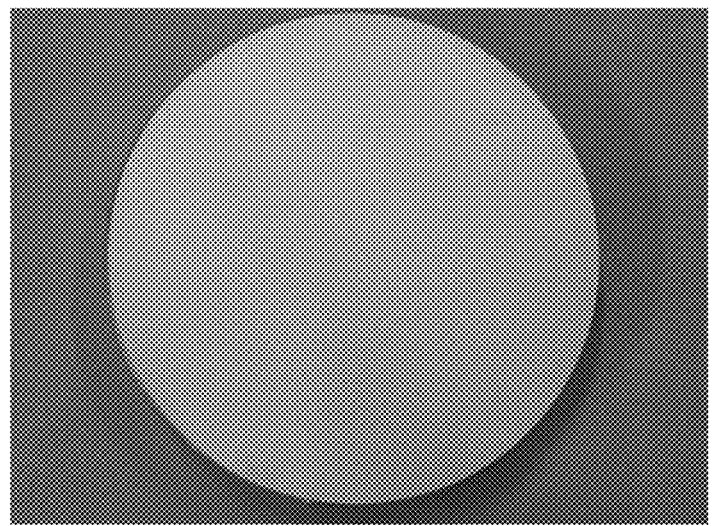
FIG. 11 is a surface observation image of a Cr alloy target material of Present Example 9 after use.
Figure 12:
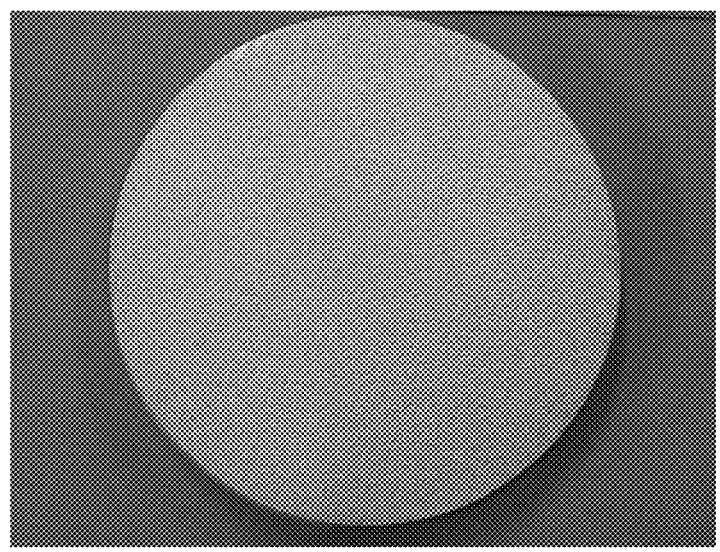
FIG. 12 is a surface observation image of a Cr alloy target material of Present Example 10 after use.

In FIG. 4 and FIG. 5 showing Comparative Example 1 and Comparative Example 2, it was confirmed that over 200 craters with a diameter of 0.5 mm or more causing adhesion of droplets were generated.

On the other hand, in the Cr alloy target materials of Present Example 1 and Present Example 2, as shown in FIG. 1 and FIG. 2, craters with a diameter of 0.5 mm or more causing adhesion of droplets were not generated at all, and the effectiveness of the present invention was confirmed. In addition, also in FIG. 3 showing Present Example 3, only 98 craters with a diameter of 0.5 mm or more were generated, and the number of craters with a diameter of 0.5 mm or more generated was significantly smaller than that of Comparative Example 1 and Comparative Example 2, and the effectiveness of the present invention was thus confirmed.

According to the Cr alloy target material of the present invention, during film formation using the same, it is possible to limit generation of craters on the surface of the Cr alloy target material and limit adhesion of droplets to the material to be treated.

Example 2

In order to obtain Cr alloy target materials as Present Example 4 to Present Example 10, the Cr powder, the Ti powder, the V powder and the B powder used in Present Example 1 were prepared.

In addition, regarding the Mo powder and the W powder, a Mo powder and a W powder with a purity 99.9 mass % obtained by reducing a $MoO_3$ powder and $WO_3$ powder and crushing them with a hammer mill were prepared.

In addition, regarding the Mn powder, commercial Mn electrolytic flakes with a purity of 99.0 mass % were melted and refined in a vacuum induction melting furnace and cast, and then crushed by a ball mill, and the obtained crushed powder was additionally classified using a sieve with an opening of 150 μm to prepare a Mn powder.

In addition, regarding the Nb powder and the Ta powder, commercial powders classified using sieves with an opening 150 μm and 45 μm were prepared.

The powders prepared as above were weighed out so that the composition formula in terms of an atomic ratio was the composition described in Table 2, and then mixed in a V type mixer, filled into a soft iron capsule, and subjected to degassing sealing under conditions of 450° C. for 4 hours, and then subjected to hot isostatic pressing under conditions of a temperature 1,180° C., a holding pressure of 100 MPa, and a holding time of 1 hour, and were pressure-sintered to produce sintered products.

The obtained sintered products were subjected to machining processing to have a diameter of 105 mm and a thickness of 16 mm and thereby Cr alloy target materials were produced.

The content and the relative density of the elements in the Cr alloy target materials produced as above were determined and calculated according to the methods in Example 1. The component analysis values and the relative density values of the Cr alloy target materials are shown in Table 2.

TABLE 2

| Sample No. | Component value [atom %] | | | | | | | | | Unavoidable impurities [mass ppm] | | | | | Relative density [%] | Number of craters [number] | Note |
|---|---|---|---|---|---|---|---|---|---|---|---|---|---|---|---|---|---|
| | Cr | Ti | V | B | Mo | Mn | W | Ta | Nb | O | S | Al | Si | S + Al + Si | | | |
| 6 | Bal. | 20.1 | — | — | 19.8 | — | — | — | — | 450 | 12 | 10 | 20 | 42 | 100.4 | 0 | Present Example 4 |
| 7 | Bal. | 20.4 | — | — | 20.2 | — | — | — | — | 2,669 | 91 | 10 | 20 | 121 | 100.4 | Exceeding 200 | Comparative Example 3 |
| 8 | Bal. | — | 20.7 | — | — | 22.1 | — | — | — | 992 | 69 | 100 | 90 | 259 | 102.2 | 4 | Present Example 5 |
| 9 | Bal. | 9.8 | 7.9 | 5.0 | 3.8 | 5.0 | — | — | — | 738 | 24 | 40 | 70 | 134 | 101.3 | 9 | Present Example 6 |
| 10 | Bal. | 0.1 | 2.9 | — | 3.2 | 3.4 | — | 0.5 | — | 325 | 23 | 20 | 50 | 93 | 99.9 | 4 | Present Example 7 |
| 11 | Bal. | 3.0 | 0.1 | 0.0 | 2.7 | 0.5 | — | — | 0.4 | 177 | 19 | 10 | 30 | 59 | 99.9 | 0 | Present Example 8 |
| 12 | Bal. | 5.3 | 0.4 | — | — | — | 0.5 | — | — | 249 | 18 | 10 | 30 | 58 | 99.9 | 0 | Present Example 9 |
| 13 | Bal. | 5.3 | 0.6 | — | — | — | 0.5 | — | — | 4,062 | 181 | 10 | 20 | 211 | 99.9 | Exceeding 200 | Comparative Example 4 |
| 14 | Bal. | 1.0 | 0.5 | 2.7 | 0.9 | 10.6 | 1.0 | 0.9 | — | 753 | 42 | 50 | 30 | 122 | 100.3 | 24 | Present Example 10 |

The Cr alloy target materials produced as above were subjected to a metal bombardment treatment under conditions described in Example 1, and the number of craters with a diameter of 0.5 mm or more formed on the surface of the Cr alloy target materials after use was measured according to the method described in Example 1. The results are shown in Table 2. Here, in Table 2, the Cr alloy target materials were evaluated such that, when the number of craters exceeds 200, it is expressed as "exceeding 200" and when the number of craters is 200 or less, the measured number is expressed.

FIG. 6 to FIG. 12 show surface observation images of the Cr alloy target materials of Present Example 4 to Present Example 10 after use. In addition, FIG. 13 and FIG. 14 show surface observation images of the Cr alloy target materials of Comparative Example 3 and Comparative Example 4 after use.

Figure 13:
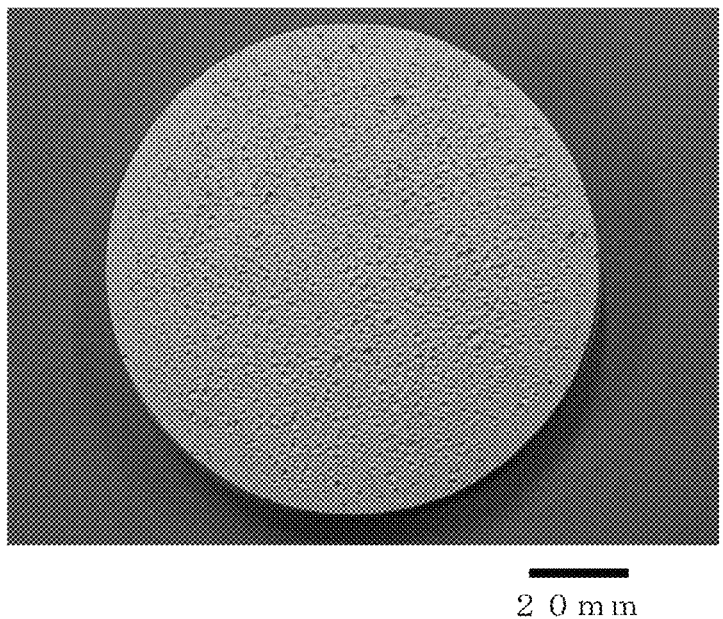
FIG. 13 is a surface observation image of a Cr alloy target material of Comparative Example 3 after use.
Figure 14:
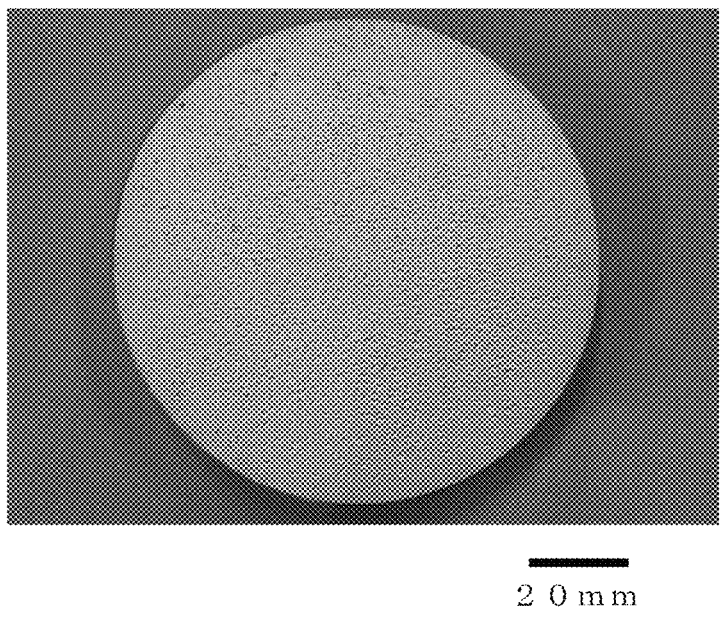
FIG. 14 is a surface observation image of a Cr alloy target material of Comparative Example 4 after use.

In FIG. 13 and FIG. 14 showing Comparative Example 3 and Comparative Example 4, it was confirmed that over 200 craters with a diameter of 0.5 mm or more causing adhesion of droplets were generated.

On the other hand, regarding the Cr alloy target materials of Present Example 4 to Present Example 10, as shown in FIG. 6 to FIG. 12, only 30 craters or less with a diameter of 0.5 mm or more causing adhesion of droplets were generated, and the effectiveness of the present invention was confirmed.

According to the Cr alloy target material of the present invention, during film formation using the same, it is possible to limit generation of craters on the surface of the Cr alloy target material and limit adhesion of droplets to the material to be treated.

The invention claimed is:

1. A Cr alloy target material having a composition formula in terms of an atomic ratio of $Cr_{100-x-y}M1_xM2_y$, $0.1 \leq x \leq 21.0$, $0.1 \leq y \leq 23.0$, in which M1 represents at least one element type selected from Ti and V, M2 represents at least one element type selected from Mo, Mn, B, W, Nb, and Ta, with the remainder being unavoidable impurities, in which 50 to 700 ppm by mass of oxygen and 60 ppm by mass or less of a total content of S, Al, and Si are contained in the unavoidable impurities.

* * * * *